US011449505B2

(12) United States Patent
Haag (10) Patent No.: US 11,449,505 B2
(45) Date of Patent: Sep. 20, 2022

(54) SYSTEM AND METHOD FOR INCREASING COMPUTING EFFICIENCY, SYSTEM AND METHOD FOR COMPRESSING A DATA BASE, SYSTEM AND METHOD FOR QUERYING A DATA BASE AND DATABASE

(71) Applicant: Albert Haag, Bad Dürkheim (DE)

(72) Inventor: Albert Haag, Bad Dürkheim (DE)

( * ) Notice: Subject to any disclaimer, the term of this patent is extended or adjusted under 35 U.S.C. 154(b) by 0 days.

(21) Appl. No.: 17/278,546

(22) PCT Filed: Sep. 20, 2019

(86) PCT No.: PCT/EP2019/075360
§ 371 (c)(1),
(2) Date: Mar. 22, 2021

(87) PCT Pub. No.: WO2020/058489
PCT Pub. Date: Mar. 26, 2020

(65) Prior Publication Data
US 2021/0349900 A1      Nov. 11, 2021

(30) Foreign Application Priority Data
Sep. 21, 2018   (EP) .................................... 18195883

(51) Int. Cl.
*G06F 16/2453* (2019.01)
*G06F 16/2455* (2019.01)
*H03M 7/30* (2006.01)

(52) U.S. Cl.
CPC .. *G06F 16/24537* (2019.01); *G06F 16/24558* (2019.01); *G06F 16/24565* (2019.01); *H03M 7/30* (2013.01)

(58) Field of Classification Search
CPC ......... G06F 16/24537; G06F 16/24558; G06F 16/24565; G06F 16/2282; H03M 7/30
See application file for complete search history.

(56) References Cited

U.S. PATENT DOCUMENTS

| 6,437,737 B1 * | 8/2002 | Azzarelli | ................ H03M 7/30 342/360 |
| 6,487,549 B1 * | 11/2002 | Amundsen | .......... G06F 16/2462 707/999.005 |
| 2017/0371927 A1 * | 12/2017 | Ramesh | ............ G06F 16/24545 |

OTHER PUBLICATIONS

Guess et al., "Increasing Transaction Processing Efficiency by Automating an Asynchronous Processor" teaches "Contextual sequence models [2] were developed to represent observed operator decisions and used as the basis for developing the program code for the AP p. 674-675" (Year: 2002).*

(Continued)

*Primary Examiner* — Mark D Featherstone
*Assistant Examiner* — Kweku William Halm
(74) *Attorney, Agent, or Firm* — Faegre Drinker Biddle & Reath LLP (57) ABSTRACT

A system for increasing computing efficiency is disclosed. The system includes a memory that stores at least one tabular constraint. The tabular constraint contains a finite array of symbols, with each symbol representing a value thereby creating a relational symbol (r-symbol), or a potentially infinite set of values, with such a symbol thereby creating a quasi-finite symbol (QF-symbol). The system includes a program configured to compress and to query the tabular constraint.

10 Claims, 4 Drawing Sheets

(56) References Cited

OTHER PUBLICATIONS

Albert Haag, "Assessing the complexity expressed in a variant table," Proceedings of the 19th International Configuration Workshop Sep. 14, 2017, pp. 1-9 (Year: 2017).*
Guess et al., "Increasing Transaction Processing Efficiency by Automating an Asynchronous Processor" (Year: 2002).*
Albert Haag, "Managing Variants of a Personalized Product" Practical Compression and Fast Evaluation of Variant Tables (Year: 2015).*
International Search Report and Written Opinion issued in International Application PCT/EP2019/075360, dated Nov. 25, 2019, 13 pages.
Jerome Amilhastre et al., "Compiling CSPs: A Complexity Map of (Non-Deterministic) Multivalued Decision Diagrams", (2014) International Journal on Artincial Intelligence Tools, vol. 23(No. 4) ISSN 0218-2130 (35 pages).
H R. Andersen et al., "A Constraint Store Based on Multivalued Decision Diagrams", In C. Bessier, ed., Principles and Practice of Constraint Programming (CP 2007), LNCS 4741, pp. 118-132.
Rudiger Berndt et al., "Multi-Valued Decision Diagrams for the Verification of Consistency in Automotive Product Data", in 2012 12th International Conference on Quality Software, Xi'an, Shaanxi, China, Aug. 27-29, 2012, pp. 189-192. IEEE, (2012).
C. Bessiere, "Constraint Propagation", published in Handbook of Constraint Programming, eds., F. Rossi, P. van Beek, and T.Walsh, chapters, Elsevier, (2006) (63 pages).
U. Blumöhr et al., "Variant Configuration with SAP", SAP Press, second edition, Galileo Press, 2012 (52 pages).
A. Haag, "Chapter 27—Product Configuration in SAP: A Retrospective", published in Knowledge-Based Configuration, eds., Alexander Felfernig, Lothar Hotz, Claire Bagley, and Juha Tiihonen, pp. 389-410, Morgan Kaufmann, Boston, (2014).
Albert Haag, "The ATMS*—An Assumption Based Problem Solving Architecture Utilizing Specialization Relations", Ph.D. dissertation, Kaiserslautern University of Technology, Germany, 1995 (125 pages).
Albert Haag, "Column Oriented Compilation of Variant Tables", in Proceedings of the 17th International Configuration Workshop, Vienna, Austria, Sep. 10-11, 2015., eds., Juha Tiihonen, Andreas A. Falkner, and Tomas Axling, vol. 1453 of CEUR Workshop Proceedings, pp. 89-96. CEUR-WS.org, (2015).
Albert Haag, "Managing variants of a personalized product" Journal of Intelligent Information Systems, (2017) vol. 49, No. 1, pp. 59-86.
Albert Haag, "Assessing the complexity expressed in a variant table", in Proceedings of the 19th International Configuration Workshop, La Defense, France, Sep. 14-15, 2017., pp. 20-27, (2017).
Albert Haag and Laura Haag, "Empowering the Use of Variant Tables in Mass Customization", in Proceedings of the MCP-CE 2018 conference, Novi Sad, Serbia, Oct. 2018, 11 pages.
G. Katsirelos et al., "A compression algorithm for large arity extensional constraints*", NICTA and UNSW [george.katsirelos, toby.walsh] @nicta.com.au), (2007) (15 pages).
Albert Haag, "Quasi-Finite Domains: Dealing with the Infinite in Mass Customization", Conference Paper, Oct. 2018 (9 pages).
Albert Haag et al., "Further Empowering Variant Tables for Mass Customization", in International Journal of Industrial Engineering and Management (IJIEM), vol. 10 No 2, Jun. 2019, pp. 155-170.

* cited by examiner

SYSTEM AND METHOD FOR INCREASING COMPUTING EFFICIENCY, SYSTEM AND METHOD FOR COMPRESSING A DATA BASE, SYSTEM AND METHOD FOR QUERYING A DATA BASE AND DATABASE

CROSS-REFERENCE TO RELATED APPLICATION

This application is a U.S. 371 national stage application of International Application No. PCT/EP2019/075360, filed 20 Sep. 2019, which claims priority to European Application No. 18195883.6, filed 21 Sep. 2018, both of which are herein incorporated by reference in their entireties.

In this invention we propose to relax finiteness in relational tables and tabular constraints in a controlled way. We preserve the syntactic representation of a row in a table as a tuple of symbols. Some of these symbols refer to an atomic value as usual. Others, which are subsequently called quasi-finite symbols (QF-symbols), refer to infinite subsets of an underlying infinite domain. Practical examples for QF-symbols are references to (uncountable) real-valued intervals and wildcards representing countably infinite sets. The goal is to provide a simple and smooth extension of the tabular paradigm, predominant in business, that is compatible with compression of the table to c-tuples [14] or to a variant decomposition diagram [11], and is amenable to constraint processing, such as local propagation. The approach is based on organizing the QF-symbols pertaining to each product property in a specialization relation [8, 9]. A specialization relation is a partial ordering that expresses specificity of meaning. A QF-symbol can be ignored in the presence of a more special one. To ensure that the sets represented by two distinct QF-symbols pertaining to the same domain are disjoint, it is further required that it must be possible to represent the intersection and set-differences of QF-symbols. In order to be able to remove duplicates implicated by a disjunction of QF-symbols from result sets of queries, it is further required that it is possible to represent their normalized set-union. QF-symbols may refer to any objects as long as the above requirements are met, e.g. regular expressions (unary predicates), rectangles (geometric shapes), etc.

In the following cited references are cited in square brackets, i.e. reference 1 as [1].

INTRODUCTION

The present application includes by reference all teachings of WO 2018/015814 A1, in particular with respect to the construction and definition of variable decision diagrams (VDD).

Offering mass customization of products to customers involves being able to keep track of and produce a large number of unique product variations. For example, a business may offer their customers the ability to build a customized t-shirt by allowing the customers to select from a predetermined list of features (e.g., characteristics)—with each unique combination of features referred to as a variant. These variants share a common basic structure (e.g., a basic T-shirt), but with individually differing features (e.g., color, size, cut, fabric). Individualized features can be described by assigning a value or word (e.g., a string such as cotton or polyester or a number such as 3.14) to each feature.

The product variants can be represented in a table where each column of the table corresponds to a feature and each row in the table represents a combination of features (e.g., a red shirt that is a size large and made of cotton). Such a table is an example of what this disclosure refers to as a variant table, which lists permissible combinations of features. For example, a variant table that is used for keeping track of products can be used to constrain customizability (e.g., restrict the number of unique products available to customers) and/or used to filter out inadmissible combinations of features in an interactive customization process (e.g., showing and providing available customizations to a customer). Because of their size, uncompressed variant tables can become difficult to work with and/or breach the limits of spreadsheet programs. And, current proposed compression techniques (e.g., multi-valued decision diagrams (MDDs) and zero-suppressed decision diagrams (ZDDs)) are not as efficient as the compression techniques disclosed herein for the purposes discussed herein.

Thus, this work expands on a common theme: that data in tabular form is a natural, non-proprietary medium for communicating between interrelated business processes within an enterprise, as well as between enterprises. We focus on mass customization (MC), which we take to be mass production with a lot size of one. A non-configurable product, amenable to mass production, can have product variants. (We use SAP terminology pertaining to the handling of products and product variants, citing reference 6, i.e. [6], as a general reference. A brief sketch of the history of the SAP Variant Configurator is given in [7]). For example, mass produced ballpoint pens come in several colors, but are otherwise identical. The offered colors are in a one-to-one correspondence with the manufactured ballpoint variants. The business attributes are maintained once for the generic ballpoint pen. Only one generic bill of materials that covers all possibilities needs to be maintained. For each variant the value of an additional product property, color, is needed to determine which ink filling and matching cap is used in assembling the variant (The SAP tables relevant for configuration are listed in [6]). MC adds customization to this setting by placing the emphasis on individualization, i.e. there will be many variants of a product and the business is prepared to produce only a single unit of each one on demand (lot size one). Accordingly, the product properties that distinguish the variants are central and potentially numerous (For simplicity of exposition, we disregard the possibility of needing to deal with variant structures, i.e. variants that have variants as parts. Our approach here addresses tabular data in general and could be extended to variant structures if needed.).

In other work, [13], the MC setting is discussed in more detail and shown that compression of variant tables, tables listing combinations of product features, is a key element in managing the exponential explosion of the number of variants caused by the increase in the number of customization choices, which production technology now enables. Here, we propose to add to the expressivity of variant tables by presenting a quasi-finite (QF) framework that allows dealing with infinite sets of choices within the tabular paradigm.

If the domains of all descriptive properties are finite, then the number of variants is finite as well. Leaving the reference to the underlying generic MC product aside, each variant is defined by a value assignment to the properties, which we represent as a relational tuple (r-tuple). If the number of offered variants is not large, these r-tuples can be maintained as rows in a database table or spreadsheet, which then acts as a product model comprised of a single tabular constraint. If desired or needed, this overall variant table can conceptually be split into smaller tables that together form a constraint satisfaction problem (CSP). Each CSP variable corresponds to a product property and each CSP solution to an offered product variant (In practice, product models are not limited to use only tabular constraints. However, the reasoning here shows that product variants could be exclusively expressed in tables in the finite case. The single overall table listing all variants can be seen the result of compiling the product model, e.g. to a decision diagram [2].) We refer to any tabular constraint on product properties as a variant table.

Variant tables are a form of modeling that is very acceptable to a business. Their downside is that they may not scale with a growing number of choices for individualization. However, we show in [13] that expected regularities in the product variants will allow a compressed form of the table to scale. Here, our choice of the compressed form is a variant decomposition diagram (VDD) [10, 11], and the associated c-tuples, a term adopted from [14] and used there for a Cartesian product of sets of values.

However, infinite domains occur in MC practice, and neither tables of r-tuples nor classic CSP approaches allow infinite sets.

SUMMARY OF INVENTION

The present invention solves the above problems by providing systems and methods for increasing computing efficiency, systems and methods for compressing a data base, systems and methods for querying a data base and databases according to the following aspects 1 to 39:
1. A system for increasing computing efficiency, the system comprising a memory storing at least one tabular constraint therein, wherein the tabular constraint contains a finite array of symbols, each symbol representing a value, which symbol is then termed a relational symbol (r-symbol), or a potentially infinite set of values, which symbol is then termed a quasi-finite symbol (QF-symbol); and a program configured to compress and to query the tabular constraint.
2. The system of aspect 1, wherein the program is configured to query the tabular constraint based on a predetermined restriction to generate a result set, the result set comprising r-symbols and/or QF-symbols.
3. The system of any of the preceding aspects, wherein the program is configured to execute for any QF-symbol negation of this symbol, intersection of this symbol with another QF-symbol and union of this symbol with another QF-symbol.
4. The system of any of the preceding aspects, wherein the program is configured to partially order at least two QF-symbols pertaining to a constraint variable according to a specialization relation between said QF-symbols, wherein a specialization relation between two QF-symbols defines one of said QF-symbols to be special to the other of said QF-symbols.
5. The system of the preceding aspect, wherein the specialization between two QF-symbols defines one of said QF-symbols to be special to the other of said QF-symbols, if the one of said QF-symbols denotes a subset of the other of said QF-symbols.
6. The system of any of the preceding aspects, wherein the program is configured to determine at least one specialization relation and/or order at least two QF-symbols according to a specialization relation upon compressing the tabular constraint and optionally to store the determined relations between the QF-symbols for later reference.
7. The system of any of the preceding aspects, wherein the program is configured to query the table with a predetermined query condition and determine at least one specialization relation and/or order at least two QF-symbols according to a specialization relation upon querying the tabular constraint for one or more variables and may replace a QF-symbol by its more special QF-symbol that represents the intersection of the query condition with the QF-symbol in the result set of the query.
8. The system of any of the preceding aspects, wherein a tabular constraint is compressed to a variant decomposition diagram (VDD) as described in WO 2018/015814 A1 where each node is labeled by a symbol, which may be either an r-symbol or a QF-symbol.
9. The system according to the preceding aspect wherein the program is configured to, upon querying the compressed tabular constraint with a query condition, which queries for one or more specific symbols for one or more product properties, where each symbol in the query is either an r-symbol or a QF-symbol, to determine the result set consisting of all tuples, which fulfill the query condition and to replace any QF-symbols in the result set by the intersection between it and the respective one or more values in the query condition.
10. The system of the preceding aspect, with a plurality of tabular constraints, each compressed to a variant decomposition diagram (VDD) as described in WO 2018/015814 A1 where each node is labeled by a symbol, which may be either an r-symbol or a QF-symbol,
    wherein said replacement is made in each tabular constraint,
    any reduction of product properties implied by said replacement in any of the partial tabular constraints is applied to each other tabular constraint of the plurality of tabular constraints, and
    repetitively applying to each other tabular constraint any reduction of product
    properties implied by the previous step, until no further reduction is implied.
11. The system of any of the preceding aspects, wherein there is an overall assignment of the constraint variables to symbols, i.e. each variable is bound to a symbol which may be an r-symbol or a QF-symbol,
    there is a plurality of tabular constraints, each referencing some subset of the variables, and
    wherein each tabular constraint is queried with a predetermined restriction that embodies the assignment to a symbol for those variables of the table references, and if it is not possible to satisfy an assignment to a symbol, a contradiction is signaled, and
    in the case of a quasi-finite symbol, this is specialized, wherein only a specialization to the empty set/false results in signaling a contradiction.
12. The system of any of the preceding aspects, wherein the program is configured to attempt to find a solution given a set of tabular constraints, where assignments to symbols are systematically explored and
    each time an assignment to a symbol is determined to be inconsistent, to track back to another assignment to a symbol until a solution is found for all assignments that have been explored.
13. The system of any of the preceding aspects, wherein the program is configured to construct and store in the memory a set-labeled variant decomposition diagram (VDD), the VDD being a VDD as described in WO 2018/015814 A1, constructed from c-tuples created and stored in advance, optionally containing r-symbols and/or QF-symbols using the following process:
group all c-tuples that have a common set first together create a node for each group,
labeling the node with the corresponding set
link the labeled nodes via LO-links,
wherein the HI-link of each node points to the root node of a set-labeled VDD that is constructed for the tails of the c-tuples belonging to the group, where the tail of a c-tuple is a shortened c-tuple obtained by removing the first element of a c-tuple.

14. A processor-based method for increasing computing efficiency, the method comprising
storing in a memory at least one tabular constraint, wherein the tabular constraint contains a finite array of symbols, each symbol representing a value, which symbol is then termed a relational symbol (r-symbol), or a potentially infinite set of values, which symbol is then termed a quasi-finite symbol (QF-symbol); and
compress and query the tabular constraint.

15. The method of aspect 14, comprising
querying the tabular constraint based on a predetermined restriction to generate a result set, the result set comprising r-symbols and/or QF-symbols.

16. The method of any of the aspects 14 to 15, comprising executing for any QF-symbol negation of this symbol, intersection of this symbol with another QF-symbol and union of this symbol with another QF-symbol.

17. The method of any of aspects 14 to 16, comprising partially ordering at least two QF-symbols pertaining to a constraint variable according to a specialization relation between said QF-symbols, wherein a specialization relation between two QF-symbols defines one of said QF-symbols to be special to the other of said QF-symbols.

18. The method of the preceding aspect, wherein the specialization between two QF-symbols defines one of said QF-symbols to be special to the other of said QF-symbols, if the one of said QF-symbols denotes a subset of the other of said QF-symbols.

19. The method of any of aspects 14 to 18, comprising determining at least one specialization relation and/or ordering at least two QF-symbols according to a specialization relation upon compressing the tabular constraint and optionally storing the determined relations between the QF-symbols for later reference.

20. The method of any of aspects 14 to 19, comprising querying the table with a predetermined query condition and determining at least one specialization relation and/or order at least two QF-symbols according to a specialization relation upon querying the tabular constraint for one or more variables and optionally replacing a QF-symbol by its more special QF-symbol that represents the intersection of the query condition with the QF-symbol in the result set of the query.

21. The method of any of aspects 14 to 20, comprising compressing a tabular constraint to a variant decomposition diagram (VDD) as described in WO 2018/015814 A1 where each node is labeled by a symbol, which may be either an r-symbol or a QF-symbol.

22. The method according to the preceding aspect comprising:
upon querying the compressed tabular constraint with a query condition, which queries for one or more specific symbols for one or more product properties, where each symbol in the query is either an r-symbol or a QF-symbol, determining the result set consisting of all tuples, which fulfill the query condition and replacing any QF-symbols in the result set by the intersection between it and the respective one or more values in the query condition.

23. The method of the preceding aspect, comprising
for a plurality of tabular constraints, each compressed to a variant decomposition diagram (VDD) as described in WO 2018/015814 A1 where each node is labeled by a symbol, which may be either an r-symbol or a QF-symbol, wherein said replacement is made in each tabular constraint, applying any reduction of product properties implied by said replacement in any of the partial tabular constraints to each other tabular constraint of the plurality of tabular constraints, and
repetitively applying to each other tabular constraint any reduction of product properties implied by the previous step, until no further reduction is implied.

24. The method of any of aspects 14 to 23, wherein
there is an overall assignment of the constraint variables to symbols, i.e. each variable is bound to a symbol which may be an r-symbol or a QF-symbol, there is a plurality of tabular constraints, each referencing some subset of the variables, and
wherein each tabular constraint is queried with a predetermined restriction that embodies the assignment to a symbol for those variables of the table references, and if it is not possible to satisfy an assignment to a symbol, a contradiction is signaled, and
in the case of a quasi-finite symbol, this is specialized, wherein only a specialization to the empty set/false results in signaling a contradiction.

25. The method of any of aspects 14 to 24, comprising attempting to find a solution given a set of tabular constraints, where assignments to symbols are systematically explored and
each time an assignment to a symbol is determined to be inconsistent, tracking back to another assignment to a symbol until a solution is found for all assignments that have been explored.

26. The method of any of aspects 14 to 25, comprising constructing and storing in the memory a set-labeled variant decomposition diagram (VDD), the VDD being a VDD as described in WO 2018/015814 A1, constructed from c-tuples created and stored in advance, optionally containing r-symbols and/or QF-symbols using the following process:
grouping all c-tuples that have a common set first together
creating a node for each group,
labeling the node with the corresponding set
linking the labeled nodes via LO-links,
wherein the HI-link of each node points to the root node of a set-labeled VDD that is constructed for the tails of the c-tuples belonging to the group, where the tail of a c-tuple is a shortened c-tuple obtained by removing the first element of a c-tuple.

27. The system or method of any of the preceding aspects, wherein the tabular constraint comprises or consists of at least one uncompressed variant table.

28. The system or method of any of the preceding aspects, wherein the compressed tabular constraint comprises or consists of
a) at least one compressed variant table comprising c-tuples, wherein c-tuples are Cartesian products of symbols or
b) at least one decision diagram (DD) like a binary decision diagram (BDD), a variant decomposition diagram (VDD) or a multi-valued decision diagram (MDD) representing c-tuples.
29. The system or method of the preceding aspects, wherein the program is configured to compress the tabular constraint to at least one variant decomposition diagram (VDD) with nodes labelled by at least a symbol as described in WO 2018/015814 A1, wherein the symbol may be an r-symbol or a QF-symbol.
30. The system or method of any of the preceding aspects, wherein a node may be a set-labelled node, where the sets labelling the node is a discrete finite set of symbols, each being an r-symbol or a QF-symbol or a single QF-symbol representing an infinite set of values.
31. The system or method of the preceding aspect, wherein the program is configured to generate from a VDD comprising set-labelled nodes at least one VDD with nodes labelled by an r-symbol by creating a node for each symbol in the set of symbols of each set-labelled node.
32. The system or method of any of the preceding aspect, wherein the program is configured to generate from a VDD comprising nodes labelled by an r-symbol or at least one VDD with set-labelled nodes.
33. The system or method of any of the preceding aspects, wherein the program is configured to compress the tabular constraint by generating a list of c-tuples as defined in WO 2018/015814 A1.
34. The system or method of the preceding aspect, wherein the program is configured to compress the list of c-tuples to a VDD.
35. The system or method of any of the preceding aspects, wherein finite symbols comprise single values and QF-symbols may comprise an infinite subsets of an infinite value domain, in particular an uncountable infinite real-valued interval, a countable infinite set of values, e.g. a wildcard to be filled by a user etc.
36. A system or method for compressing a database comprising a tabular constraint, the system comprising a system according to any of aspects 1 to 13 and 27 to 35 and/or the method comprising a method according to any of aspects 14 to 26 and 27 to 35.
37. A system or method for querying a database comprising a tabular constraint, the system comprising a system according to any of aspects 1 to 13 and 27 to 35 and/or the method comprising a method according to any of aspects 14 to 26 and 27 to 35.
38. A database in a system according to any of aspects 1 to 13 and 27 to 35.
39. A method, a system, a data structure, a table and/or a database substantially as described herein with reference to any one of the Examples.

In this invention we propose to relax finiteness in variant tables, and by extension in the associated constraint processing, in a controlled way. Our goal is to provide a simple and smooth extension of the tabular paradigm that retains its acceptance in business, and, particularly, allows compression to a VDD and c-tuples. We preserve the syntactic representation of a row in a table as a tuple of symbols, while allowing some of these, which we call quasi-finite symbols (QF-symbols), to refer to infinite sets. A symbol for a real-valued interval, which is uncountably infinite by definition, is an example of a QF-symbol. A wildcard symbol that refers to an infinite domain is also a QF-symbol. In contrast, a wildcard for a finite domain is just an alias for the finite set of values. We treat this as "syntactic sugar" and equivalent to the expanded set of values.

The approach we take here is illustrated by 2 examples and based on the following ideas (This extends the simple processing of real-valued intervals and wildcards proposed in [10, 11] for a set-labeled VDD.):

i) Each property domain is defined by a finite set of symbols:
   a finite domain by its values, which we refer to as r-symbols,
   an infinite domain by one or more (disjoint) QF-symbols.
ii) We represent an assignment of a symbol to each product property as a tuple of symbols. If the tuple contains only r-symbols, it is an r-tuple. If it also contains QF-symbols, we call it a Qf-tuple. Both r-tuples and Qf-tuples are interpreted a special cases of a c-tuple, where an r-symbol in the tuple is treated as a singleton set.
iii) We adapt the concept of a specialization relation from [8, 9] to QF-symbols. When queries or constraint solving need to consider two different QF-symbols for the same property simultaneously, they can ignore both symbols and focus instead on the more special symbol for their set intersection.
iv) Only a finite number of QF-symbols is needed, which can be derived in advance from the product model (e.g. the property domains and the variant tables) (If further QF-symbols are generated dynamically externally, the specialization relation will have to be extended dynamically. Nevertheless, at any given time a finite number of symbols will be needed)
v) Compression to a VDD, and through that to c-tuples, can be done as in the finite case, if we can ensure certain requirements are met.

One difference between a QF-symbol and an r-symbol is that the former still allows choice, i.e. it can be specialized or restricted further when required. The consequence is that some constraints may need to be formulated in non-tabular form, e.g. to express that for two real-valued properties length and width it should hold that: length≥width. These constraints can be seen as inter-property predicates. Whereas we discuss unary intra-property predicates as QF-symbols, we will not deal with other inter-property predicates in this paper, except to note in passing that restricting real-valued intervals with numeric linear (in)equalities is an established technique (see Section 7.2) that can be smoothly integrated with our intended processing.

We show how configuration queries over variant tables with QF-symbols can be meaningfully supported. We also believe that the concept of specialization relations is an important bridge to constraint processing in general. The idea of defining a specialization relation via the subset-relation can be inverted: given a set of symbols from the column of a table that correspond to elements of a partial order, such that a unique greatest successor and a unique least common predecessor exists for any two elements, these symbols can be treated in a like manner to QF-symbols for purposes of queries and constraint processing, if we are willing to interpret the partial order as a specialization relation.

Furthermore, certain embodiments of the present disclosure are directed to various approaches to decompose variant tables and to evaluate the decomposed variant tables. The decomposed tables can be considered to be compressed representations of the variant table. The compressed variant tables maintain the benefits of an uncompressed table (e.g., relationships among data) while being easier to read and faster to evaluate, manipulate, and/or deploy. These approaches involve VDDs, which are a compact representation of a variant table and which comprise a series of nodes and links that can be used to evaluate (e.g., filter, iterate, access) the variant table.

While the disclosure is amenable to various modifications and alternative forms, specific embodiments have been shown by way of example in the drawings and are described in detail below. The intention, however, is not to limit the disclosure to the particular embodiments described but instead is intended to cover all modifications, equivalents, and alternatives falling within the scope the appended claims.

DETAILED DESCRIPTION

As a preliminary remark, a variant decomposition diagram (VDD) comprises a series of nodes and links that represent an uncompressed variant table. In other words, a VDD is a compact representation of a variant table, i.e. a compressed variant table. VDDs maintain the benefits of and core functionalities expected with an uncompressed table (e.g., a database, spreadsheet) while being faster to evaluate, manipulate, and deploy. For example, like a conventional database or spreadsheet, the VDDs can be searched, filtered, counted, ordered, iterated, exported/imported (e.g., as a spreadsheet, database), directly accessed (including to the n-th row), and/or otherwise evaluated—but do so quicker than a conventional and/or conventionally-compressed database or spreadsheet. VDDs are described in detail in WO 2018/015814 A1.

As described in more detail below, the compression techniques discussed below may result in a VDD with fewer nodes for a given variant table—compared to other compression approaches. Use of the inventive concepts and in particular use of c-tuples and VDDs and other related techniques described herein results in improvements in computing power usage and computation speed compared to use of conventional and/or conventionally-handled database structures. Uncompressed tabular constraints, compressed tabular constraints, like VDDs, and c-tuples in combination with the inventive concepts of handling and querying these database structures are thus more useful for practical, real-time applications. The various embodiments described herein provide several distinct advantages over existing database structures and techniques.

Example 1

Example 1 is structured in 10 sections as follows:
A database approach to configuration is summarized in section 1
The topic of compression to VDDs and c-tuples is summarized in section 2.
An extensive example based on an personalizable (MC) T-shirt is shown in section 3.
the construction of VDDs from QF-tuples and its basic problem of ensuring disjoint c-tuples is summarized in section 4.
Motivating examples of QF-symbols and how they meet the requirements is shown in section 5.
Queries to variant tables with QF-symbols are discussed in section 6.
Specialization relations and their relation to constraint processing are discussed in section 7.
Local propagation working seamlessly is shown in section 7.2. We also show that using QF-symbols (and c-tuples in general) directly in the definition of a product variant has business benefits
Handling Indeterminism in Variant and Sub-Variants is shown in section 8.
A summary is provided in section 9.
References are provided in section 10

1. Configuration in the Database Paradigm

The easiest MC business setting is when the business offering is a small finite set of product variants actually represented in extensional form in a relational database table or spreadsheet. Even when this is not possible, due to the size such a table would have, tabular constraints can be used to define the valid variants. The extensional form of a tabular constraint naturally supports various data queries such as (1) and (2), here formulated in SQL, which are the most relevant for configuration as discussed in [11]. The approach here may be extended to cover further SQL queries, which is not described here in further detail.

The query in (1) returns a result set of all variants matching the user's criteria. In the SQL syntax an IN term in the WHERE clause need not be specified where no restriction is intended. However, for purposes of representing a query condition as a c-tuple (see Section 3), we will substitute $R_j = D_j$ for an omitted IN term. The k product properties are denoted by $v_1, \ldots, v_k$. The variant table is denoted as (vtab). ($R_j$) denotes a subset of the domain $D_j$ for product property $v_j$. The values of interest to a user when configuring can be communicated in the WHERE clause.

SELECT * FROM (vtab)

WHERE $(v_1)$ IN $(R_1)$ AND ... $(v_k)$ IN $(R_k)$;  (1)

The query in (2) returns the domain restriction for property $v_j$
under the WHERE clause.

SELECT DISTINCT $(v_j)$ FROM (vtab)

WHERE $(v_1)$ IN $(R_1)$ AND ... $(v_k)$ IN $(R_k)$;  (2)

These queries can also be done to further filter the result sets of previous queries (see [11, 10]).

To sum up: tabular constraints in extensional form can be evaluated using database queries. In [11] we have shown that this extends to tables represented as VDDs in a way that also guarantees the efficiency of the queries. We now have to show here how to handle the queries (1) and particularly (2) in conjunction with QF-symbols.

2. C-Tuples, Table Compression, and Decision Diagrams

The discussion of compression in this section is illustrated with examples using a simple T-shirt in Section 3.

In the finite case a variant can be represented as an r-tuple. If we substitute sets for values in this tuple, the tuple is no longer relational, but represents the Cartesian set of all r-tuples that can be formed as combinations using values from the sets. We call such a Cartesian tuple a c-tuple. We adapt the term from [14], which investigates direct compression to c-tuples. As a tuple we denote it by $C = (C_1, C_2, \ldots, c_k)$, where $C_j \subset D_j$ and $D_j$ is the domain of the product property $v_j \in \{v1, \ldots, vk\}$. As a Cartesian set it would be written as $C=C1 \times C2 \times \ldots \times Ck$.

In the context of the above definition, we don't care whether an element $C_j$ of a c-tuple is finite or infinite. Note that the set of r-tuples represented by a c-tuple is uncountable if one of the sets in the c-tuple refers to a real-valued interval.

The WHERE clause with the k IN operators in (1) and (2) itself describes a c-tuple $(R_1, \ldots, R_k)$, which expresses the set of values the user (the problem solving agent) believes in. We will refer to this c-tuple as the query condition. We will allow a query condition to be any c-tuple from our variant domain.

C-tuples offer a way to compress tables. For example, if the set of all variants is totally unconstrained, this can be represented by a single c-tuple, which is the Cartesian product of the product domains. With constraints, there will be more c-tuples, but often a c-tuple representation is much more compact than the extensional form [12]. For this reason, c-tuples are already used both formally and informally in configuration practice.

In the case of finite domains, a set of c-tuples can be further compressed to a decision diagram (DD). We use the form of a Variant Decomposition Diagram (VDD). As introduced in [10, 11], a VDD is a binary rooted Directed Acyclic Graph (DAG), where each node has a label denoting the assignment of a property to a value (r-symbol). Here we will allow QF-symbols in node labels as well. Each node has two emanating links, HI and LO, which we characterize as follows given a fixed ordering of the product properties: $v_1, \ldots, v_k$. Under these assumptions, a multi-valued decision diagram (MDD), a more widely known form of a DD [3, 1], can be mapped to a VDD. This is further detailed in [11]:

- the HI-link of a node points to a node for the next product property $v_{(j+1)}$ or to the terminal sink T(true) from last column nodes.
- the LO-link points to an alternate value assignment for the same product property $v_j$ or to the terminal sink $\bot$ (false).

We will call a chain of nodes linked via LO-links an I-chain. If more than one QF-symbol appears in an I-chain, the QF-symbols must denote disjoint sets, in order to allow a unique decision for a node, given a value assignment.

Nodes in an I-chain that all have a common HI-link represent the disjunction of their value assignments and could be merged into one set-labeled node. In [10, 11] we introduced a VDD with set-labeled nodes, where a node was labeled with a finite set of r-symbols representing a disjunction of value assignments. Since any node labeled with such a set can be re-expanded into an I-chain of regular VDD nodes, nodes that assign the symbols one at a time, we do not propose to use VDDs with set-labeled nodes in practice. We use them here in Section 3 to simplify the exposition.

A VDD is functionally equivalent to the extensional form of the table it represents from the perspective of the queries relevant for configuration (1) and (2), see [11]. The extension of these queries to include QF-symbols is the topic of Section 6. A VDD can also support counting the number of tuples in a table or a result set of a query and access a tuple directly by its position in the table/result set.

3. T-Shirt Example

3.1 Classic Finite T-Shirt Variants

In [10] the concepts of representing a variant table using a VDD are illustrated using an example of a simple T-Shirt.

We use this example here both to illustrate the concepts discussed so far, and also to illustrate the proposed extension to infinite sets.

The simple T-shirt has the three properties Imprint ($v_1$), Size ($v_2$), and Color ($v_3$) with the finite domains:

{MIB (Men in Black), STW (Save the Whales)}
{L (Large), M (Medium), S (Small)}
[Black, Blue, Red, White]

Only 11 variants are valid due to constraints that state that MIB implies Black and STW implies ¬S(Small), where the operator "¬" denotes negation ("not"). Table 1 is the extensional form of the variant table, which is small enough to be used as the only and definitive representation of the variants for the purposes of both business and configuration. It encodes the underlying CSP as a single tabular constraint.

The query (1) can be used to filter the variants to the set matching any given selection criteria (query condition) $(R_1, \ldots, R_k)$. For example, if the user needs a small (S) sized T-shirt, there is only one solution (the first row in Table 1). Alternatively, if a Red T-shirt is desired, there are two variants that satisfy this (eighth and ninth rows), and the domains are restricted as follows: Imprint∈{STW}, Size∈{Medium, Large}, and Color∈{Red} by applying the query (2) for each property in turn.

TABLE 1

| Simple T-shirt | | |
|---|---|---|
| Imprint Size Color | Size | Color |
| MIB | S | Black |
| MIB | M | Black |
| STW | M | Black |
| STW | L | Black |
| STW | M | White |
| STW | L | White |
| STW | M | Red |
| STW | L | Red |
| STW | M | Blue |
| STW | L | Blue |

Figure 1:
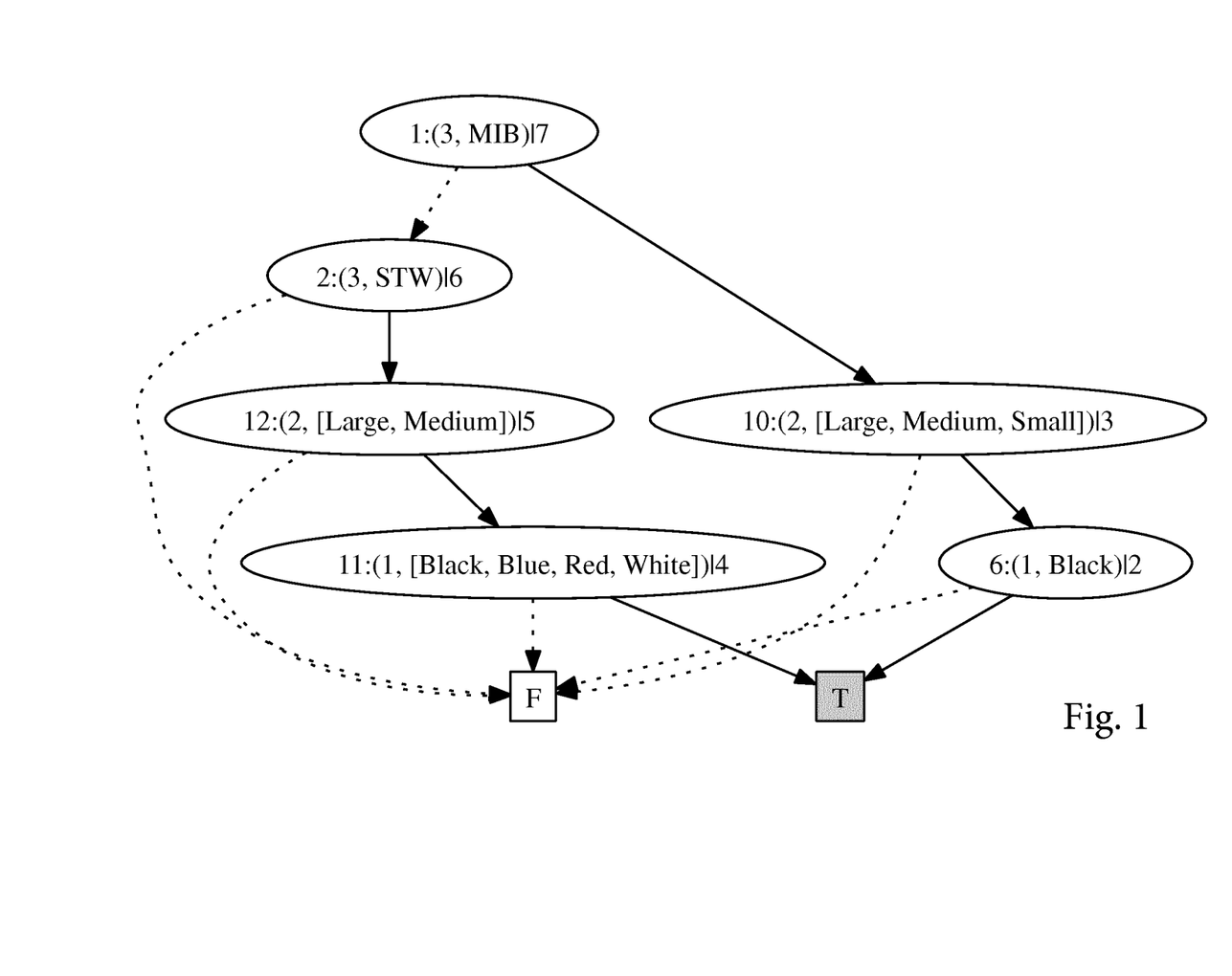
FIG. 1 shows a VDD of the T-shirt with finite set-labeled nodes in Example 1.

FIG. 1 depicts a VDD with set-labeled nodes for Table 1. The HI-links in each path from the root to the sink>in the VDD in FIG. 1 define a c-tuple. The set of all c-tuples that can be formed is disjoint and is a way to represent Table 1 in compressed form.

3.2 T-Shirt with Infinite Domains

Table 2 lists the two c-tuples needed to represent the 11 variants.

TABLE 2

| C-tuples for simple T-shirt | | |
|---|---|---|
| Imprint | Size | color |
| MIB | S; M; L | Black |
| STW | M; L | Black; White; Red; Blue |

To illustrate the use of infinite sets, we modify the example to allow an arbitrary user-provided image as an imprint on a white T-shirt. An image is identified at runtime via a file name. The file name must refer to a processable graphic, which is taken to mean that only a jpg or a tiff format can be accepted. Hence, the domain is the in-finite set of all legal file names that match the regular expression (img-filename)=*.jpg|*.tiff.

We also add a property Scale to capture a factor to be used to scale the image printed on the T-shirt. For the vintage prints MIB and STW we require Scale=1. For the user-provided images, the scale can be arbitrarily chosen by the user as a floating point number in the range 0.5 to 1 (the interval [0.5, 1.0]).

Table 3 lists the c-tuples needed to describe this setting. The product property Scale has here been placed as the first property $v_1$. The other properties are now $v_2$ (Imprint), $v_3$ (Size), and $v_4$ (Color).

TABLE 3

C-tuples for simple T-shirt with infinite domains

| Scale | Imprint | Size | Color |
|---|---|---|---|
| 1.0 | MIB | S; M; L | Black |
| 1.0 | STW | M; LL | Black; White; Red; Blue |
| [0.5, 1.0] | (img-filename) | S; M; L | White |

Figure 2:
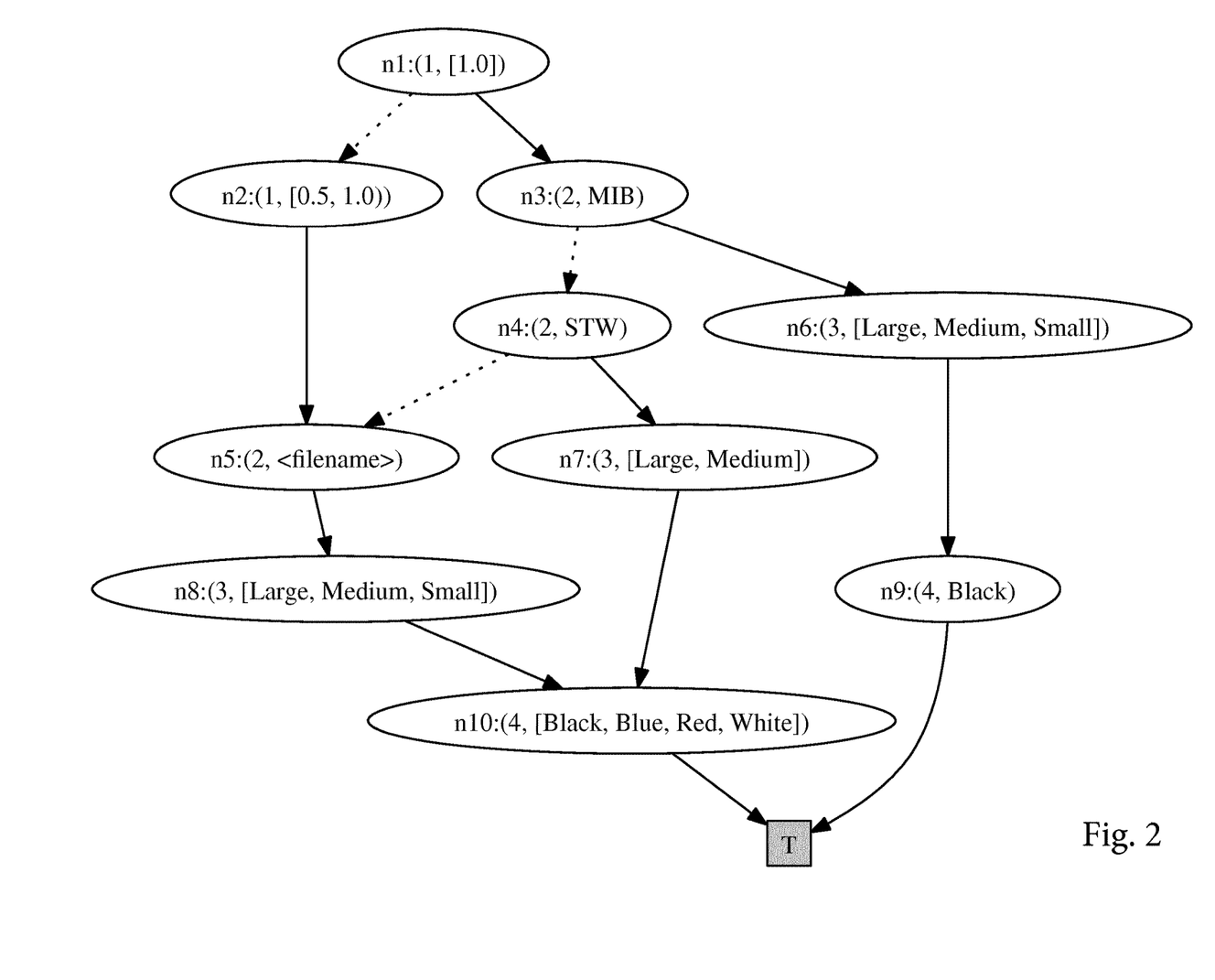
FIG. 2 shows a VDD of the T-shirt with non-finite set-labeled nodes in Example 1.

We now discuss how to construct a VDD with set-labeled nodes for these c-tuples. FIG. 2 shows the result.

We construct a root node $v_1$ labeled $(v_1, [1.0])$ starting with the first c-tuple. This node will be used for both the first and second c-tuples in Table 3.

We construct the I-chain (chain of LO-links) for the root node:

We pointed out above that nodes linked in an I-chain need joint set labels. This is illustrated here.

It will be a problem if we label $v_2$ with [0.5, 1.0] (third c-tuple), because then the value Scale=1.0 does not allow deciding uniquely for either $v_1$ or $v_2$. So we split [0.5, 1.0] into the two disjoint c-tuples.

TABLE 4

| Scale | Imprint | Size | Color |
|---|---|---|---|
| 1.0 | MIB | S; M; L | Black |
| 1.0 | STW | M; L | Black; White; Red; Blue |
| [1.0] | (img-filename) | S; M; L | White |
| [0.5, 1.0] | (img-filename) | S; M; L | White |

Table 4 shows all the c-tuples to be handled in constructing the VDD. The new third c-tuple is covered by $v_1$. We label the second node $v_2$, linked from $v_1$ via its LO-link, with the half-open interval [0.5, 1.0) from the fourth c-tuple. This handles the first column.

We next process the rest of the three tuples in Table 4 that start with $C_1 := [1.0]$. We create:

$v_3$, the target for the HI-link of $v_1$, labeled with $(v_2, \text{MIB})$ $v_4$, the target for the LO-link of $v_3$, labeled with $(v_2, \text{STW})$ $v_5$, the target for the LO-link of $v_4$, labeled with $(v_2, (\text{img-filename}))$ It is straightforward to handle the third column for the above three c-tuples: nodes $v_3$, $v_4$, and $v_5$ have their HI-links pointing to nodes $v_6$, $v_7$, and $v_8$, respectively with the labels depicted in FIG. 2:

The first of the c-tuples allows only the color Black (node $v_9$).

The second allows all colors (node $v_{10}$), and the third allows only the color White (node $v_{11}$). This completely handles the first three c-tuples.

We note that we skirted the issue that the product property Imprint ($v_2$) allows both values from a finite list ({MIB, STW}) as well as arbitrary "additional" values ((img-filename)). This is not uncommon in practice where a "standard" solution is modeled with a predefined finite domain, but additional values are allowed (see [6]). The sets {MIB}, {STW} and (img-filename) are effectively treated as disjoint by the VDD due to the constructed I-chain of nodes $v_3$, $v_4$, and $v_5$). This could be formally ensured by augmenting the element (img-filename) to (img-filename)$\cap \neg$ {MIB,STW} (see Section 6).

Lastly, we discuss some exemplary queries. QF queries are the subject of Section 6. The query to Table 1 for small (S) T-Shirts yielded a result set consisting of one r-tuple (the first row). The domains for the three product properties were restricted to {MIB}, {S}, and {Black}. The same query condition against Table 4 yields three c-tuples (the first, third and fourth c-tuple). Each of these c-tuples in the result set must be intersected with the query condition to eliminate the sizes medium (M) and large (L) that are in the c-tuples but excluded by the query condition. Consequently, the domains for the four product properties are restricted to [0.5, 1.0] {MIB, (img-filename)}, {S}, and {Black, White}.

Similarly, the query to Table 1 for Red T-Shirts yielded a result set consisting of two r-tuples (the eighth and ninth row). Against Table 4 the result set consists of one (the second) c-tuple. After intersection with the query condition the four product properties are restricted to [1.0] {STW}, {M,L}, and {Red}.

Instead, if the query condition simply specifies a file name for a particular image, my-img.jpg, then the last two c-tuples would be the result set. They agree completely except in the first column. As there is no need for the split here (as there was when constructing the original VDD), the two tuples could be combined into one:

([0.5, 1.0], (img-filename), {S, M, L}, White)

The result set intersected with the external condition is then:

([0.5, 1.0], {my-img.jpg}, {S, M, L}, White)

If the query formulates the additional restriction Scale $\in [0.25, 0.75]$, then the result set intersected with the external condition is:

([0.5, 0.75], {my-img.jpg}, {S, M, L}, White)

4. Construction of VDDs from C-Tuples

A c-tuple C can be decomposed into its first element $C_1$ and its tail T, which is also a c-tuple.

We denote this by $C := C_1/T$:

$$C := (C_1, \ldots, C_k) = C_1/(C_2, \ldots, C_k) = C_1/T \quad (3)$$

When constructing a (partial) VDD from a list of c-tuples $C_1, \ldots C_m$ an I-chain for the head (root) node is constructed using the first elements $C_{11}, C_{21}, \ldots, C_{m1}$. As evident from the example in Section 3.2 these elements must be disjoint. If there are two c-tuples $C_i$, $C_i t$ with the same tail, i.e.

$$C_i = C_{i1}/T \text{ and } C_i t_1 = C_i t_1/T$$

then their first elements must be merged to yield one c-tuple $$C' = (C_{i1} \cup C_i t_1)/T$$

We can ensure disjointness of any other pair of c-tuples $C_i$, $C_i t$ with differing tails $$C_i = C_{i1}/T_i \text{ and } C_i t_1 = C_i t_1/T_i t$$

by replacing them with the three c-tuples $C_a$, $C_b$, $C_c$ in (4) (a c-tuple with an empty element is considered empty and can be disregarded):

$$C_a = (C_{i1} \backslash C_i t_1)/T_i$$

$$C_b = (C_i t_1 \backslash C_{i1})/T_i t$$

$$C_c = (C_{i1} \cap C_i t_1)/(T_i \cup T_i t) \quad (4)$$

As the example in Section 3.2 shows, the c-tuples show up directly as labels of set-labeled nodes. We already stated that a set-labeled node labeled with a finite set of symbols (r-symbols or QF-symbols) expanded to an I-chain of regular VDD nodes.

5. Operations with Non-Finite Elements in C-Tuples

As the discussion in Section 5 and the example in Section 3 make clear, it will be necessary to both split and combine c-tuples when constructing a VDD and result sets. Therefore, we need the following operations on c-tuple elements $C_{ij}$, $C_i t_j$ pertaining to the same product property $v_j$:
  set intersection: $C_{ij} \cap C_i t_j$
  set union: $C_{ij} \cup C_i t_j$
  negation with respect to the overall domain: $\neg C_{ij} := D_j \setminus C_{ij}$
  set difference: $C_{ij} \setminus C_i t_j = C_{ij} \cap \neg C_i t_j$ For finite sets this is a given. For QF-symbols that are used in the labels of VDD nodes, we must ensure that these operations are well defined and fit in our QF framework.

In the following subsections we look at this in detail for the infinite elements we propose to add:
  Real-valued intervals
  Unconstrained countably infinite sets
  Sets of exclusions, particularly finite exclusion sets.
Where the domain underlying negation needs to be made clear we will denote negation as:

$$\neg C := C^D = D \setminus C$$

5.1 Real-Valued Intervals and the Xnumeric Datatype

We denote a real-valued interval using conventional mathematical notation, e.g. [a, b) for a half-open interval with a closed lower bound a and an open upper bound b. This is the set of all real numbers x such that $x >= a \wedge x < b$. All interval bounds can be open or closed. We allow lower and upper infinity as open bounds, denoted by -inf and +inf. A single real number x can be encoded as a singleton interval [x].

We define an xnumeric to be a finite list of real-valued intervals representing the union of its elements in a normalized form. Normalized means that the intervals in the list are disjoint, separable, and in ascending order, e.g. the set of intervals {[0.5, 1.0), [1.0]} is disjoint and ascending, but it is not separable. In normalized form it is just [0.5, 1.0]. (Remark: The interval {[0.5, 1.0), (1.0, 2.0]} is separable and thus normalized, because its two intervals are separated by the "gap" of the singleton interval [1.0].)

For xnumerics it is straightforward to ensure normalization. First, any intervals that are non-disjoint or not separable can be merged into one interval. Since the remaining intervals are disjoint, they can be ordered. Hence the union of two xnumeric is just the set union followed by normalization. The intersection is just the list of pair wise intersections. Because the xnumeric is ordered due to normalization, this operation is efficient in the sense that it is not necessary to actually intersect all pairs.

The set union of two intervals is not necessarily again an interval, hence we need the concept of an xnumeric.

The unconstrained xnumeric is the interval (-inf, +inf). The negation of an xnumeric is the set difference to this unconstrained set. It is formed by inverting the finite number of "gaps" between the intervals in the xnumeric. For example $$\neg\{[0.5, 1.0), (1.0, 2.0]\} = \{(-\inf, 0.5), [1.0], (2.0, +\inf)\}$$

Remark: a finite set of real number values can be represented as an xnumeric using singleton intervals. All interaction with finite sets is covered by the above operations defined for xnumerics.

An xnumeric is a list of QF-symbols (intervals) representing their set union. A set-labeled node for an xnumeric can be expanded to an I-chain of nodes with interval labels.

5.2 Countably Infinite Sets and Domains

Examples of Countably Infinite Domains are the List of all Integers or all Strings.

This requires that each product property is associated with an immutable data type. We consider a domain D or any $C \subset D$ to be qualified by a unary predicate (condition) that filters out disallowed values at run-time (e.g. a regular expression for a string). Any value fulfilling the predicate (e.g. any string matching the regular expression) is an acceptable value. Examples for qualifying predicates for an integer data type are: positive p, even p or odd p. In the absence of more specialized predicates (true) is taken as the default predicate.

A unary predicate can be represented by its name (a symbol), which serves as the QF-symbol identifying it. In the example in Section 3, we used the notation (img-filename) to refer to a regular expression for legal file names.

The set operations translate into logical operations for predicates.

The union of two infinite sets qualified by predicates $\pi_1$ and $\pi_2$ is just a set qualified with the disjunction $\pi_1 \vee \pi_2$. Similarly, intersection translates to $\pi_1 \wedge \pi_2$, and negation to $\neg \pi_1$. In the absence of more specialized predicates, (true) is taken as the default predicate.

Again, we require normalization to reduce a complex logical expression by removing any redundant elements. It has yet to be determined what works best in practice here. From a theoretical view, we might require a disjunctive normal form (DNF). The overall predicate could then be represented as a list (finite set) of conjunctions. A set-labeled node for such a list can be expanded to an I-chain of nodes, as for xnumerics. Each such node would be labeled by a conjunction of predicates, which would be treated as an indivisible QF-symbol.

We must also deal with set unions between finite sets and countably infinite sets. In the example in Section 3, the standard imprints for the T-shirt formed a finite set {MIB, STW}, but "additional values" were then allowed, which were specified by the QF-symbol (img-filename). The domain of the property imprint is just the union of these sets. Generally, the domain D for a product property with a non-xnumeric datatype is $D = \{F, \pi\} := F \cup \pi$, where F is a finite set of values, $\pi$ a predicate representing an countable infinite set, and both F and in respect the datatype assigned to the product property. Ideally, F and $\pi$ will be disjoint. Either F or $\pi$ can be empty. We define the predicate (false) to represent the empty set.

The set-operations then become:
  set intersection: $\{F,(\pi)\} \cap \{F',(\pi')\} = \{F \cap F',(\pi \wedge \pi')\}$
  set union: $\{F,(\pi)\} \cup \{F',(\pi')\} = \{F \cup F',(\pi \vee \pi')\}\pi$
  negation: $\neg\{F,(\pi)\} := F^c \cap \neg(\pi)$
  set difference: $\{F,(\pi)\} \setminus \{F',(\pi')\} = \{F'',\neg F',(\pi)\setminus(\pi')\}$—
    where $F''$ is the finite set $F \setminus F' \cup F \setminus (\pi')$, and $\pi$—the finite set $\neg F' = F'$ is an exclusion set of all values in F' that lie in $(\pi)$ (see Section 5.3).

5.3 Exclusions and Exclusion Sets

An exclusion of a value x from a property domain D is a way of stating $D \setminus \{x\}$. It means that x is considered to be invalid, which we will denote by $\neg x$. For real-valued domains, exclusions can be directly formulated as xnumerics, e.g., $\{(-\inf, x)(x, +\inf)\}$ would exclude the real number x. For a finite domain or an xnumeric domain, we can simply positively represent the set $D\setminus\{x\}$. For a countably infinite domain, we need further expressiveness. Given a countably infinite domain D for a product property and a finite set of values $E \subset D$, D
we introduce an exclusion set $\neg E := E := D\setminus E$. An exclusion set $\neg E$ can be merged with a unary predicate $\pi$ by removing any values from E that do not satisfy the predicate $\pi$, i.e. $\neg E \cap (\pi) \subset E$ is a reduced exclusion set. In order to keep the exposition simple, we will ignore this reduction and denote $\neg E \cap (\pi)$ also by $\neg E$.

For two exclusion sets $\neg E$, $\neg E'$, the required set operations are inverted:
set intersection: $\neg E \cap \neg E' = \neg (E \cup E')$
set union: $\neg E \cup \neg E' = \neg (E \cap E')$
negation: $\neg \neg E = D\setminus(D\setminus E) = E$
set difference: $\neg E \setminus \neg E' = \neg (E' \setminus E)$ Finite exclusion sets are needed in order to meet our requirements of negation of finite sets against infinite domains. The concept can also be extended to infinite exclusion sets. Indeed, a negated unary predicate corresponds to such a set. For example, if the set of all prime numbers is represented by the unary predicate (prime p), the $\neg$(prime p) represents exclusion of all prime integers.

In either case, a reference to an exclusion set is treated as a QF-symbol. For example, for a predicate $\pi$, $\neg \pi$ is the symbol representing the exclusion of all values in $\pi$.

6. Queries on Quasi-Finite VDDs

In the classic finite case, the result set R of the query (1) is a finite set of r-tuples. In the QF framework, it is a finite set of qf-tuples that may contain both r-symbols and QF-symbols. A QF-symbol in the result set must be specialized to conform to the query condition, e.g. by set intersection with the query condition. Problem solving (PS) must expect the remaining degree of non-determinism.

The query (2) contains the keyword DISTINCT. This means any duplicates must be removed from the result set for the particular column (property). We see replacing QF-symbols by their normalized union akin to removing duplicates. Therefore, the symbols in the result set, both QF-symbols and r-symbols, must be replaced by their normalized union, which ensures also that remaining symbols are pairwise disjoint.

7. Constraint Processing with Quasi-Finite Symbols

7.1 Specialization Relations

Given two QF-symbols $\varphi_1$, $\varphi_2$ for the same CSP variable, we regard $\varphi_2$ to be more special than $\varphi_1$ if $\varphi_2$ denotes a subset of $\varphi_1$. This leads to a partial ordering (PO) of the symbols that occur in the variant tables, which we call a specialization relation, introduced and motivated for another context in [9]. Generally, a specialization relation on a set of facts expresses specificity of meaning, characterized by the following three properties:

Problem solving (PS) need not consider an otherwise valid fact in the presence of a more special one (procedural-subsumption property). This property requires the acquiescence of PS.

A fact is logically implied by any of its specializations (semantic-compatibility property).

Negation inverts specialization (symmetry-under-negation property).

The facts we deal with in this paper are value assignments to a CSP variable represented by r-symbols and QF-symbols. The PS we consider consists of queries to the table and constraint processing, particularly local propagation of constraints. From the perspective of queries we additionally need to be able to aggregate the result sets into a normalized form, e.g. delete duplicate r-symbols, replace two QF-symbols by a more general one representing their union, etc. We have shown in Section 5 that the QF-symbols we primarily envision meet these requirements.

We can also turn the reasoning around and define a PO of symbols pertaining to the same property domain as a specialization relation if we can show that it has the above properties and if we also guarantee the following:

There is a unique symbol $\bot$ (false) that is a special of all other symbols. This is a QF-symbol for the empty set.

For any two symbols in the PO, there exists a unique symbol for a greatest common successor/special (the "intersection").

For any two symbols in the PO, there exists a symbol for a least common predecessor/general (the "union").

There is a unique top-level symbol $\Omega$ that represents the entire domain. For any symbol $\varphi$ in the PO, there exists a symbol $\neg \varphi$ in the PO, such that the least common predecessor of $\varphi$ and $\neg \varphi$ is $\Omega$ and the greatest common successor is $\bot$. $\neg \varphi$ denotes the negation of $\varphi$ For example, we could arrange images in a PO and declare it a specialization relation, paying some attention to fulfill the requirements in the spirit of the intended PS.

Specialization relations provide some conceptual and practical benefits:

They can be pre-calculated and stored in a graph. This may be more performant than calculating intersections and unions on the fly.

They provide a general concept to adapt PS to QF-symbols: PS must be simply be prepared to specialize the assignment of a QF-symbol to a CSP variable.

They generalize to other objects, e.g. shapes, images, taxonomies, etc.

7.2 Local Propagation with QF-Symbols

If a product model contains multiple constraints, local propagation [4] can be used to restrict the domains of the product properties to a state of arc consistency. Any domain restriction of a product property is propagated to all constrains that reference the same product property. The process continues until no further restrictions are possible. For a tabular constraint, the query (2) can be used to determine the domain restrictions, which are then propagated (see Section 6).

The QF framework fits nicely in this scheme. A c-tuple comprised of finite sets of symbols that may include the normalized union of QF-symbols may be used as a query condition. The domain restrictions that result from the query (2) with this query condition may again contain the normalized union of QF-symbols. The c-tuple formed from the resulting domain restriction for each column can be smoothly propagated to other constraints.

If the product model is entirely made-up of tabular constraints, the local propagation of QF-symbols is covered by our approach. It is also possible to define local propagation of real-valued intervals for numeric linear (in)equalities and to propagate the result. This is implemented in the SAP product configurators ([6]). Further extending the propagation of QF-symbols is a topic of future work.

8. Indeterminism in Variants and Sub-Variants

A product variant is classically defined as an r-tuple, a value assignment to each of its product properties, but this is neither ideal nor sufficient in practice. Some degree of indeterminism in a variant is needed when a variant is to be further specialized in a later business process (e.g., at the customer's site). For example, a pump may be sold with a connection that fits several different sizes of hoses. The end customer may have to make a manual adjustment for the particular hose they want to attach by cutting off a part of the provided connector. The pump being sold to the customer by the business is a variant of their MC "pump" product that allows further individualization at the customer's site.

The number of sub-variants can be infinite, e.g. for the frequency a radio receiver may be tuned to. As built, the property Frequency would be described by a list of real-valued intervals for possible reception bands, e.g. {[7.2, 7.45], [9.4, 9.9], [11.6, 12.1]} (MHz).

Allowing a variant to be defined by a c-tuple solves the above problem. However, c-tuples that define variants must be distinguished from those that are merely the by-product of compression. This would be an open MC business topic.

9. Summary and Outlook

This work extends a common theme: that data in tabular form is not only natural for modeling variants, but also a natural, non-proprietary medium for communicating between interrelated business processes within an enterprise, as well as between enterprises. Compression of tables is essential in MC for letting variant tables scale with a growing number of choices, which production technology now enables [13]. C-tuples are a transparent yet powerful form of compression that is transparent and upon which non-proprietary exchange formats can be based. This theme is addressed in other work, e.g. [13].

Here, we propose to add to the expressivity of variant tables by presenting a quasi-finite (QF) framework that allows dealing with infinite sets of choices within the tabular paradigm.

We believe the QF framework meets these expectations. The dis-cussed techniques involving c-tuples and VDDs using QF-symbols has not yet been deployed in practice. The individual ingredients: c-tuples, VDDs, and the management of partial orders (POs) for specialization relations have all been applied with positive results. As already mentioned, the question of how to define practical normalization of predicates is open. However, we believe that the primary open issue is to verify that it actually meets the expectations of MC business. This also includes evaluating the worth of integrating linear (in)equality constraints, and the business value of indeterminism in product variants.

10. References

[1] Jerome Amilhastre, Helene Fargier, Alexandre Niveau, and Cedric Pralet, 'Compiling csps: A complexity map of (non-deterministic) multivalued decision diagrams', International Journal on Artificial Intelligence Tools, 23(4), (2014).

[2] Henrik Reif Andersen, Tarik Hadzic, John N. Hooker, and Peter Tiedemann, 'A constraint store based on multivalued decision diagrams', In Bessiere [5], pp. 118-132.

[3] Rüdiger Berndt, Peter Bazan, Kai-Steffen Jens Hielscher, Reinhard German, and Martin Lukasiewycz, 'Multi-valued decision diagrams for the verification of consistency in automotive product data', in 2012 12th International Conference on Quality Software, Xi'an, Shaanxi, China, Aug. 27-29, 2012, eds., Antony Tang and Henry Muccini, pp. 189-192. IEEE, (2012).

[4] C. Bessiere, 'Constraint propagation', in Handbook of Constraint Programming, eds., F. Rossi, P. van Beek, and T. Walsh, chapter 3, Elsevier, (2006).

[5] Christian Bessiere, ed. Principles and Practice of Constraint Programming—CP 2007, 13th International Conference, C P 2007, Providence, R.I., USA, Sep. 23-27, 2007, Proceedings, volume 4741 of Lecture Notes in Computer Science. Springer, 2007.

[6] U. Blumöhr, M. Munch, and M. Ukalovic, Variant Configuration with SAP, second edition, SAP Press, Galileo Press, 2012.

[7] A. Haag, 'Chapter 27—Product Configuration in SAP: A Retrospective', in Knowledge-Based Configuration, eds., Alexander Felfernig, Lothar Hotz, Claire Bagley, and Juha Tiihonen, 319-337, Morgan Kaufmann, Boston, (2014).

[8] Albert Haag, 'Konzepte zur praktischen Handhabbarkeit einer atms-basierten Problemlösung', in Das PLAKON-Buch, Ein Expertensystemkern für Planungs- and Konfigurierungsaufgaben in technischen Domänen, eds., Roman Cunis, Andreas Gunter, and Helmut Strecker, volume 266 of Informatik-Fachberichte, 212-237, Springer, (1991).

[9] Albert Haag, The ATMS—an assumption based problem solving architecture utilizing specialization relations, Ph.D. dissertation, Kaiserslautern University of Technology, Germany, 1995.

[10] Albert Haag, 'Column oriented compilation of variant tables', in Proceedings of the 17th International Configuration Workshop, Vienna, Austria, Sep. 10-11, 2015., eds., Juha Tiihonen, Andreas A. Falkner, and Tomas Axling, volume 1453 of CEUR Workshop Proceedings, pp. 89-96. CEUR-WS.org, (2015).

[11] Albert Haag, 'Managing variants of a personalized product', Journal of Intelligent Information Systems, 1-28, (2016).

[12] Albert Haag, 'Assessing the complexity expressed in a variant table', in Proceedings of the 19th International Configuration Workshop, La Defense, France, Sep. 14-15, 2017., pp. 20-27, (2017).

[13] Albert Haag and Laura Haag, 'Empowering the use of variant tables in mass customization', in Proceedings of the MCP-CE 2018 conference, Novi Sad, Serbia, not yet published.

[14] G. Katsirelos and T. Walsh, 'A compression algorithm for large arity extensional constraints', In Bessiere [5], pp. 379-393.

Example 2

In the following a further example for the use of quasi-finite symbols and specialization relations upon query of a tabular constraint is provided.

The previous T-shirt example is extended by introducing the following properties of an imprint as described in further tables below: Quality, Granularity and Scale.

"Quality" and "Granularity" relate to an associated image. Quality encodes resolution against a normed size of the image and Granularity the level of fine grained detail that the image is to convey. A poorer Quality limits how the image can be enlarged. Higher Granularity limits how the image may be shrunk. The possible values for Quality and Granularity will be organized in specialization relations given below in FIG. 3 and FIG. 4.

For Scale, without regard to consistency with the example presented in the paper, one may assume that the normed size of an image must be scaled with a factor denoted "Scale" in the real-valued interval [0.1, 2.0] to meet the given requirements of a T-shirt on which it is to be imprinted.

This T-shirt example is further extended by specifying the property of "ImpSiz" (imprint size), which states the desired size of the imprint on the T-shirt. It can take one of the values: 'Cute', 'Big', and 'Fill'. 'Fill' indicates that the available space for printing is to be used as completely as possible. 'Big' indicates a larger imprint, in a size optimal to the print but not necessarily filling the available space. 'Cute' indicates a small imprint size, even where space is available. A further table below captures the scaling range allowed for positioning an imprint in the desired size on a T-shirt.

Figure 3:
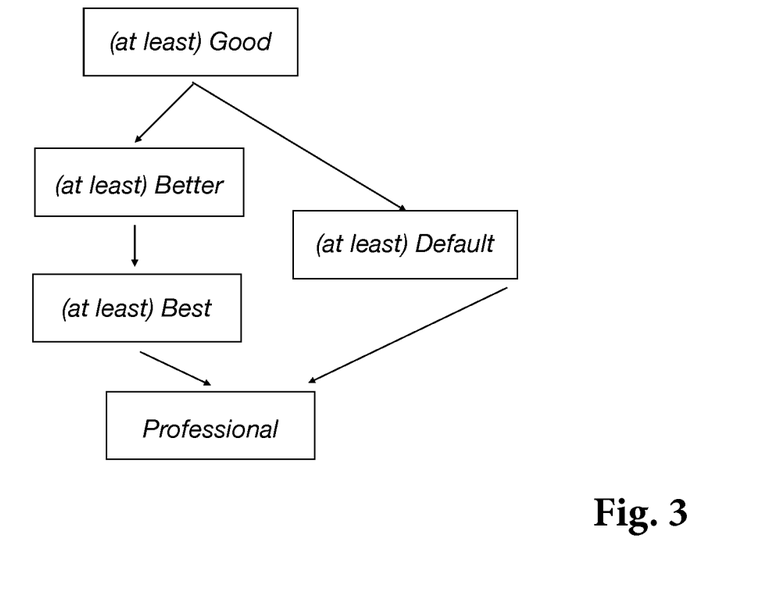
FIG. 3 shows a graph depicting specialization relations for Quality in Example 2.
Figure 4:
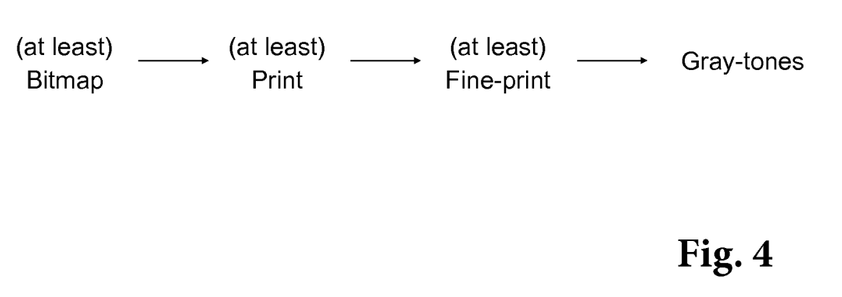
FIG. 4 shows a graph depicting specialization relations for Granularity in Example 2.

In this example, the following general propositions for each property can be made:
  Quality and Granularity symbols can be seen as QF symbols ordered in a finite specialization graph (FIG. 3, FIG. 4 below).
  Scale is expressed in real-valued intervals. For these the set-intersection and set-union functions can be executed at run-time (i.e. upon query) to determine specialization/generalization relations. Nevertheless, the finite number of QF-symbols for Scale that occur in the tables (and their finite closure under intersection and union) may instead also be pre-arranged in a finite specialization relation graph, which has the advantage of not needing any calculations at run-time. Such specialization relation graph may, e.g. be stored in a look-up.
  Poor quality and high granularity will limit the use of the imprints on the T-shirts.
In this example, the following general propositions on specialization relations between different values/symbol for each property and their partial ordering can be made:
  Quality may assume the following values: ('at least . . . ') ' . . . Good', ' . . . Better', ' . . . Best', ' . . . Default', and 'Professional', arranged in a partial order as shown in FIG. 3, wherein values, which are special to other values are position below said other values.
  Negation of property "Quality" may be interpreted as "poorer than . . . " as follows:

TABLE 2_1

| Negation | Interpretation | Consequences |
| --- | --- | --- |
| 'Professional' | poorer than 'Professional' | At most 'Best', 'Default' |
| 'Best' | poorer than 'Best' | At most 'Better', 'Default' |
| 'Default' | poorer than 'Default' | At most 'Good' |
| 'Better' | poorer than 'Better' | At most 'Good' |
| 'Good' | poorer than 'Good' | false, inconsistent |

Granularity

The values of Granularity are arranged as a total order for simplicity (from most general to most special): ('at least . . . ') ' . . . Bitmap', ' . . . Print', ' . . . Fine-print', and ' . . . Gray-tones' as shown in FIG. 4. Negation corresponds to an inversion, and must be interpreted accordingly (Poorer than . . . ):

TABLE 2_2

| Negation | Interpretation | Consequences |
| --- | --- | --- |
| 'Gray-tones' | Poorer than 'Gray-tones' | At most 'Fine-print' |
| 'Fine-print' | Poorer than 'Fine-print' | At most 'Print' |

TABLE 2_2-continued

| Negation | Interpretation | Consequences |
| --- | --- | --- |
| 'Print' | Poorer than 'Print' | At most 'Bitmap' |
| 'Bitmap' | Poorer than 'Bitmap' | false, inconsistent |

Scale

The finite values for scale or intervals of scale ranges, their intersections and unions can be arranged in a specialization relation. The top node of this relation is the interval [0.5, 2.0]. The bottom node is the empty set. A single value x is treated as the singleton interval [x].

Tabular Constraints

The following tabular constraints are assumed to exist between quality and scale, between granularity and scale and between Size, ImpSiz and Scale:

TABLE 2_3

Quality/Scale relationship

| Quality | Scale |
| --- | --- |
| Good | [0.1, 0.75] |
| Better | [0.1, 1.0] |
| Default | [0.1, 1.25] |
| Best | [0.1, 1.5] |
| Professional | [0.1, 2.0] |

TABLE 2_4

Granularity/Scale relationship

| Granularity | Scale |
| --- | --- |
| Bitmap | [0.1, 2.0] |
| Print | [0.5, 2.0] |
| Fine-print | [0.75, 2.0] |
| Gray-tones | [1.0, 2.0] |

TABLE 2_5

Size/ImpSiz/Scale relationship

| Size | ImpSiz | Scale relationship |
| --- | --- | --- |
| S | Cute | [0.1, 0.2] |
| S | Big | [0.5, 0.6] |
| S | Fill | [0.7, 0.9] |
| M | Cute | [0.2, 0.3] |
| M | Big | [0.75, 0.9] |
| M | Fill | [1.0, 1.2] |
| L | Cute | [0.25, 0.4] |
| L | Big | [0.75, 0.9] |
| L | Fill | [1.3, 1.9] |

Initial QF-symbol Binding of a Variable for Scale Property, Constraint Propagation Variables for each of the properties are specialized in the context of problem solving. Initially one starts with the most general known facts bound to these variables:
  Quality='Good' (at least . . . ),
  Scale=[0.1, 2.0],
  Granularity='Bitmap' (at least . . . ),
  Size={'S', 'M', 'L'}, and
  ImpSiz={'Cute', 'Big', 'Fill'}.
As examples the following queries can be made:
1) Determine Size and ImpSiz from given Granularity, i.e. starting with the initial state above and given an image with Granularity='Gray-tones', determine the set of compatible sizes and imprint sizes of T-shirts.

If the variable Granularity is specialized to Granularity='Gray-tones', table 2_4 designates Scale [1.0, 2.0], which in turn excludes in table 2_3 the Quality 'Good'. Due to this exclusions, the binding of the variables for Quality and Scale are then replaced (specialized) to:
Quality={'Better', 'Default'} (at least . . . )
Scale=[1.0, 2.0],
Table 2_5 then allows specializing the bindings of the variables for Size and ImpSiz to:
Size={'M', 'L'}, and
ImpSiz={'Fill'}
This in turn allows further specialization of Scale to (non-interval xnumeric):
Scale={[1.0, 1.2], [1.3, 1.9]}
2) Determine required Quality/Granularity from Size and ImpSiz Starting with the initial state above and a T-shirt with Size='M', determine the set of compatible imprints. Based on Size='M' table 2_5 allows specializing the bindings of the variable Scale to:
Scale={[0.2, 0.3], [0.75, 0.9], [1.0, 1.2]}
Then Granularity, Quality and ImpSiz specialize to
Granularity='Bitmap' (at least . . . )
Quality='Good' (at least . . . )
ImpSiz={'Cute', 'Big', 'Fill'}.
Now additionally requesting by the query ImpSiz='Cute' leads to:
Scale=[0.2, 0.3]
Granularity=¬'Print' (implies ¬'Fine-print' and ¬'Gray-tones'), i.e. "at most 'Bitmap'"
Quality='Good' (at least . . . )
ImpSiz={'Cute'}.
A further simultaneous query for ImpSiz='Cute' and Granularity='Print' would have led to an inconsistency necessitating the revision of one of the two choices.

SUMMARY

Although this disclosure describes tabular constraints, specialization relations and constraint propagation in the context of tables for product variants, aspects of the present disclosure are useful in many types of databases includes those involving large tables. Various modifications and additions can be made to the embodiments disclosed without departing from the scope of this disclosure. For example, while the embodiments described above refer to particular features, the scope of this disclosure also includes embodiments having different combinations of features and embodiments that do not include all of the described features. Accordingly, the scope of the present disclosure is intended to include all such alternatives, modifications, and variations as falling within the scope of the claims, together with all equivalents thereof.

The invention claimed is:

1. A system for increasing computing efficiency, the system comprising a memory storing at least one tabular constraint therein, wherein the tabular constraint contains a finite array of symbols, each symbol representing a value, which symbol is then termed a relational symbol (r-symbol), or a potentially infinite set of values, which symbol is then termed a quasi-finite symbol (QF-symbol); and
a program configured to compress and to query the tabular constraint,
wherein the program is configured to partially order at least two QF-symbols pertaining to a constraint variable according to a specialization relation between said QF-symbols,
wherein a specialization relation between two QF-symbols defines one of said QF-symbols to be special to the other of said QF-symbols.

2. The system of claim 1, wherein the program is configured to query the tabular constraint based on a predetermined restriction to generate a result set, the result set comprising r-symbols and/or QF-symbols.

3. The system of claim 1, wherein the program is configured to execute for any QF-symbol negation of this symbol, intersection of this symbol with another QF-symbol and union of this symbol with another QF-symbol.

4. A processor-based method for increasing computing efficiency, the method comprising:
storing in a memory at least one tabular constraint, wherein the tabular constraint contains a finite array of symbols, each symbol representing a value, which symbol is then termed a relational symbol (r-symbol), or a potentially infinite set of values, which symbol is then termed a quasi-finite symbol (QF-symbol);
partially ordering at least two QF-symbols pertaining to a constraint variable according to a specialization relation between said QF-symbols, wherein a specialization relation between two QF-symbols defines one of said QF-symbols to be special to the other of said QF-symbols; and
compress and query the tabular constraint.

5. The method of claim 4, comprising querying the tabular constraint based on a predetermined restriction to generate a result set, the result set comprising r-symbols and/or QF-symbols.

6. The method of claim 4, comprising executing for any QF-symbol negation of this symbol, intersection of this symbol with another QF-symbol and union of this symbol with another QF-symbol.

7. The system of claim 1, wherein the tabular constraint comprises at least one uncompressed variant table.

8. The system of claim 1, wherein the compressed tabular constraint comprises:
a) at least one compressed variant table comprising c-tuples, wherein c-tuples are Cartesian products of symbols or
b) at least one decision diagram (DD) being a binary decision diagram (BDD), a variant decomposition diagram (VDD) or a multi-valued decision diagram (MDD) representing c-tuples.

9. The method of claim 4, wherein the tabular constraint comprises at least one uncompressed variant table.

10. The method of claim 4, wherein the compressed tabular constraint comprises:
a) at least one compressed variant table comprising c-tuples, wherein c-tuples are Cartesian products of symbols or
b) at least one decision diagram (DD) being a binary decision diagram (BDD), a variant decomposition diagram (VDD) or a multi-valued decision diagram (MDD) representing c-tuples.

* * * * *